United States Patent [19]

Debiec et al.

[11] 4,200,975

[45] May 6, 1980

[54] ADDITIVE METHOD OF FORMING CIRCUIT CROSSOVERS

[75] Inventors: Richard P. Debiec, LaGrange Park; William T. Wydra, Darien, both of Ill.

[73] Assignee: Western Electric Company, Incorporated, New York, N.Y.

[21] Appl. No.: 910,989

[22] Filed: May 30, 1978

[51] Int. Cl.² .......................................... H01R 43/00
[52] U.S. Cl. ........................................ 29/827; 29/842; 29/847; 357/80; 357/65; 357/68; 427/96; 427/125
[58] Field of Search ......................... 29/625, 628, 629; 357/68, 65; 164/97, 98, 75, 14; 427/272, 282, 286, 287, 96, 125

[56] References Cited

U.S. PATENT DOCUMENTS

| | | | |
|---|---|---|---|
| B 231,416 | 3/1976 | Marcantonio | 29/625 X |
| 2,629,907 | 3/1953 | Hugger | 29/625 |
| 3,461,524 | 8/1969 | Lepselter | |
| 3,562,040 | 10/1971 | Burns et al. | |
| 3,597,839 | 8/1971 | Jacodine | 357/65 X |
| 3,667,988 | 6/1972 | Horiki | 427/282 |
| 3,729,816 | 5/1973 | Burns | |
| 4,000,054 | 12/1976 | Marcantonio | 29/625 X |
| 4,054,484 | 10/1977 | Lesh et al. | |

OTHER PUBLICATIONS

Western Electric Engineer, vol. XX, No. 2, pp. 3-6, Apr. 1976.

Primary Examiner—Francis S. Husar
Assistant Examiner—C. J. Arbes
Attorney, Agent, or Firm—K. R. Bergum

[57] ABSTRACT

Through the use of a uniquely constructed molybdenum frame, a completely additive fabrication method may advantageously be employed to form an array of minute interconnecting circuit crossovers directly on the frame, using photolithographic and plating processes, with the requisite arches of the crossovers being directly formed within specially configured grooves of the frame during the plating operation. The frame is thereafter initially used as a temporary crossover carrier member, and subsequently as a bonding member during the thermo-compression bonding of the individual crossovers to respectively associated bond sites of the circuit, which typically may be of the integrated thin or thick film type. Such a simplified additive crossover generating technique advantageously obviates the need of not only potentially circuit-damaging chemical etching operations, but the many associated processing and handling steps associated therewith.

16 Claims, 5 Drawing Figures

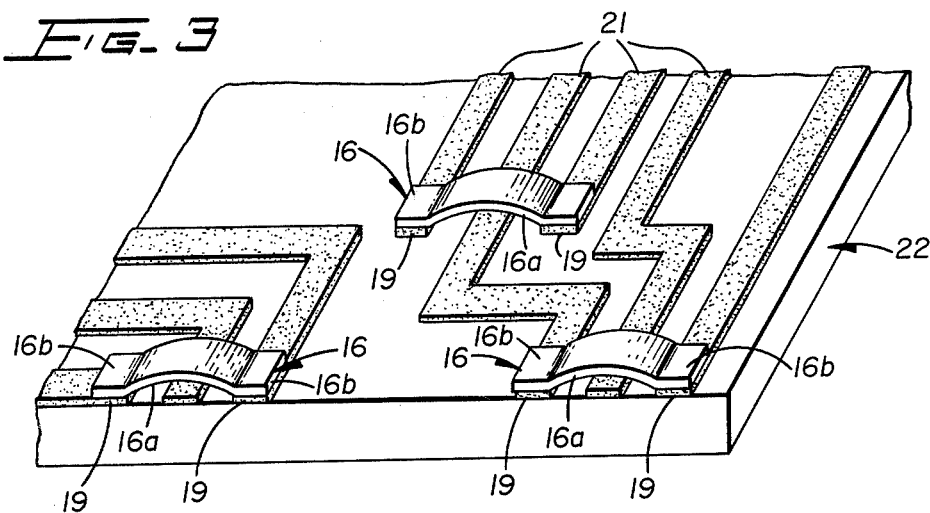
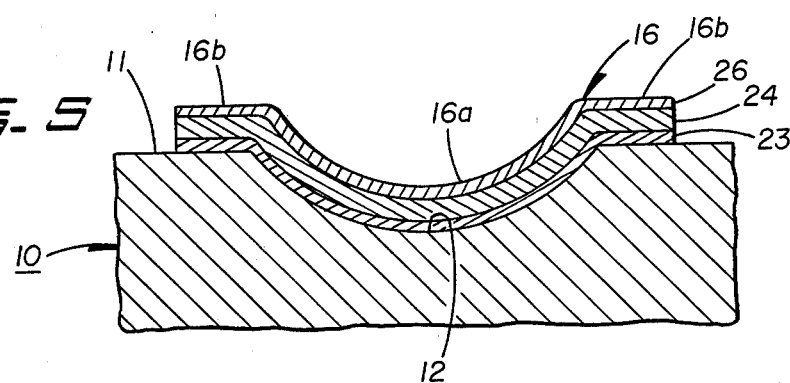
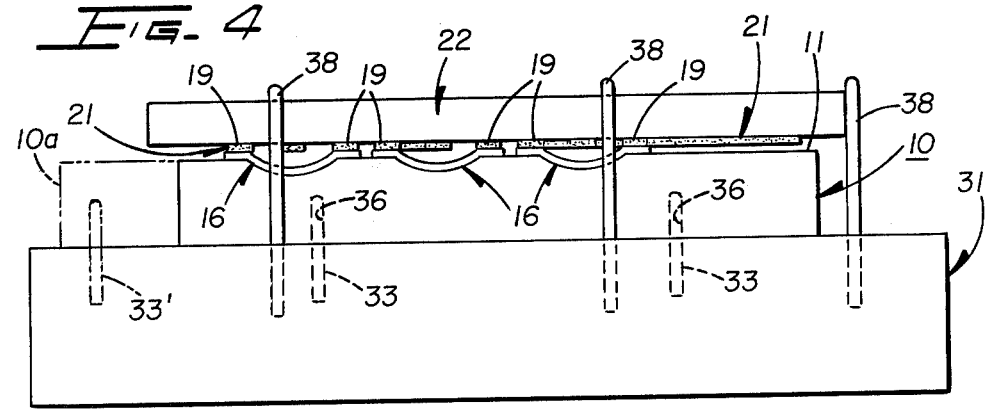

ADDITIVE METHOD OF FORMING CIRCUIT CROSSOVERS

BACKGROUND OF THE INVENTION

1. Field of the Invention

This invention relates to the fabrication of integrated circuits, such as of the thin film integrated circuit type and, more particularly, to the fabrication of circuit crossovers, and the subsequent bonding thereof to respectively associated bond sites of the circuit.

2. Description of the Prior Art

With the ever increasing complexity and density of integrated circuitry processed and/or fabricated on ceramic substrates, the need for interconnecting circuit "crossovers", of three-dimensional configuration, have often proven essential in order to optimize the utilization of substrate surface area. As the name implies, a crossover essentially comprises a bridge-like element which allows different portions of a circuit, such as two spaced bonding pads or sites, to be interconnected, while an intermediate portion of the crossover extends out of the otherwise uniform plane of the circuit so as to bridge an intervening metallized circuit path or element.

The complexity of the problem of fabricating and bonding an array of crossovers to an otherwise completely fabricated integrated circuit may be appreciated by the following typical example. In one representative hybrid integrated circuit pack employed in an electronic telephone switching system, the supporting ceramic substrate measures $3\frac{1}{4}"\times 4"$, with not only dozens of individual silicon integrated circuits and 92 lead connections, but over 4,000 crossovers. Each crossover typically measures from 4 to 6 mils in width, 40 to 80 mils in length, and 25 to 50 microns in thickness, with an intermediate bowed region having an arch height on the order of 3 mils, and with the spacings between crossovers often being as close as 12 mils, center to center.

One prior method of fabricating such crossovers is dislcosed in U.S. Pat. No. 3,461,524, of M. P. Lepselter, assigned to Bell Telephone Laboratories. In that method, generally referred to as a plated beam method, an intermediate conductive layer, such as of copper, is initially deposited over each circuit element which is to be crossed over, or bridged, and an outer conductive layer, such as of gold, is then deposited over the intermediate layer and onto selected areas of different portions of the circuit which are to be interconnected on opposite sides of each circuit element to be bridged. The intermidiate material is then removed so as to leave an air dielectric between each crossover and the bridged circuit element. If desired, a permanent solid dielectric can be deposited between the formed crossovers and respectively bridged circuit elements. A similar technique for fabricating plated beam type crossovers is disclosed in an article entitled "Batch Bonded Crossovers for Thin Film Circuits", published in the Western Electric Engineer, Vol. XX, No. 2, April 1976.

U.S. Pat. No. 4,054,484 of N. G. Lesh et al., also assigned to Bell Telephone Laboratories, discloses a crossover fabrication technique wherein evaporated layers of titanium and copper are used as base layers to build up a beam-type crossover spacing layer. A nickel protective layer is formed over the evaporated layers, as well as over the circuit areas initially formed on the substrate. A copper spacing layer is then plated over the nickel layer. Spaced pairs of pillar holes are then etched in selected areas of both the copper spacing layer and the nickel protective layer to expose spaced regions of the initially formed circuit therebelow to be interconnected. This is followed by forming the desired interconnecting gold crossovers on the copper spacing layer. The copper spacing layer is finally removed by an etchant which preferentially attacks the copper. The nickel protective layer and the copper base layers are also removed, preferably with the same etchant.

While the aforementioned plated beam crossover techniques are capable of producing well-defined and extremely minute crossovers, such techniques do give rise to several potentially serious manufacturing problems. First, the processing steps required are both time consuming and costly. Secondly, the etchants required to remove selected material to form the plated beam type crossovers may often be incompatible with other circuit materials and/or devices forming the composite circuit, thereby possibly resulting in damage to the circuit, even when great care is taken in the fabricating, as well as handling, of the circuit. With respect to handling, it is readily apparent that the more times the circuit and/or crossovers must be manipulated in carrying out the necessary processing steps, the more susceptible is the circuit to damage. Thirdly, it will be appreciated that there is no simple, reliable way of testing whether plated beam type crossovers are adequately secured to the circuit, as it would be extremely difficult, as well as time consuming and expensive, to test the bond strength of such crossovers on either an individual or random basis. Moreover, even if random testing were employed, it is very difficult to perform peel tests on plated-beam type crossovers without either destroying the bonds, or otherwise damaging the crossovers.

As a result of the problems and costs encountered in fabricating plated-beam type crossovers, a batch bonded method was developed and is disclosed in J. A. Burns et al. U.S. Pat. No. 3,762,040, assigned to the same assignee as the present invention. In accordance with one preferred version of this last-mentioned method, an array of metallic crossovers are initially formed as minute bars, i.e., without arched regions, on a carrier member, such as a copper-polyimide laminated film, in accordance with any one of a number of conventional mask-defined, metal plating techniques. The resultant array of two-dimensional plated crossovers are thereafter formed, in conjunction with a specially constructed backing member (having an array of slos that correspond with the generated array of crossovers), by an extrusion or deformation technique either prior to or during the subsequent bonding of the crossovers to a circuit. This technique is also disclosed in the aforementioned Western Electric Engineer article.

J. A. Burns U.S. Pat. No. 3,729,816, also assigned to the same assignee as the present invention, discloses the use of a batch bonded technique for generating temporary crossovers for use in the electrical testing of portions of a thin film circuit during the fabrication thereof.

The prior batch bonded crossover method has a number of advantages over the plated-beam crossover method. First, the number of photoresist, plating and etching steps are considerably reduced. This leads to lower fabrication costs, and often higher yields. Higher yields are also more often realized with the prior batch bonded versus plated beam crossover fabrication method because the former method is carried out completely independently of the considerably more expensive thin film circuit-generating method. As a result, both the fabricated crossover array and the associated integrated circuit may be independently examined for defects prior to the crossovers being bonded to the circuit as the last, or one of the last, steps involved in the fabrication of a complete, composite circuit.

Notwithstanding the significant advantages realized by utilizing the prior batch bonded crossover method, the fact remains that it has nevertheless still proven to be a relatively costly method, primarily because of not only the necessity of having to use a rather expensive copper-polyimide laminate carrier, but because of the attendant photoresist and chemical etching steps required to generate the array of crossovers, not to mention the additional steps involved to form the arched regions thereof. In addition, when the etched window backing member, employed to form the crossover arches, is also used as a temporary frame for the copper-polyimide film, and is preferably made of molybdenum (for reasons discussed in greater detail hereinafter), the cumulative exposure thereof to the necessary copper etchant unfortunately has been found to limit its life to about fifty operating cycles. As such backing members, particularly when formed with complex arrays of precision formed etched windows, are rather expensive, it is seen that their periodic replacement costs alone may constitute an appreciable portion of the overall costs of fabricating thin film integrated circuits, with batch-bonded crossovers of the type in question, in high volume manufacturing operations.

SUMMARY OF THE INVENTION

It, therefore, is an object of the present invention to generate an array of circuit crossovers, and thereafter bond them simultaneously to respectively associated bonding sites of an integrated circuit, in a simplified, inexpensive and reliable manner, by obviating the need during the fabrication of the crossovers of any chemical etchants, or of a costly copper-polyimide laminate, as well as of any separate crossover deformation or extrusion steps to produce the requisite arches therein either before or during the bonding thereof to the circuit.

In accordance with the principles of the present invention, the above and other objects are realized by utilizing a completely additive method, and a specially constructed molybdenum frame, to fabricate, through a plating operation, an array of circuit crossovers, with the necessary arches, directly on the frame. Thereafter, the completely fabricated array of crossovers are transferred en masse from the frame to, and simultaneously bonded on, respectively associated circuit pads or bond sites of an otherwise completely fabricated integrated circuit, such as of the thin or thick film type. In order to carry out such a unique crossover fabrication method, the crossover-supporting frame is initially constructed with a plurality of parallel extending grooves on at least one side thereof, with the grooves each having a concave or semi-circular base.

With the normal gold-to-gold bonds established between each fabricated crossover and the associated circuit bond sites producing peel strengths considerably greater then those initially established between each plated crossover and the frame, the latter may be advantageously cleanly peeled from the array of circuit-bonded crossovers for reuse. This peeling step advantageously also inherently provides a reliable way of testing the adequacy of the permanent bonds.

Even more significant, however, are the appreciable cost savings realized in fabricating crossovers in accordance with the subject method, and specially constructed molybdenum frame. More specifically, the present invention obviates the prior time consuming and costly series of photolithographic processing steps performed either directly on the integrated circuit substrate (in forming plated beam crossovers), or indirectly on a rather expensive copper/polyimide laminate (in forming prior batch bonded crossovers). In the latter case, of course, the actual forming of the arches also involves a number of additional steps, the exact number depending on whether the arches are formed before or during the bonding of the crossovers to the circuit. Further indirect cost savings are realized in accordance with the present invention, as compared to the prior batch bonded methods, by the considerably increased life of the molybdenum frames (or backing members) made possible by their not having to be subjected to any chemical etchants.

BRIEF DESCRIPTION OF THE DRAWINGS

FIG. 3 is an enlarged, fragmentary perspective view of the thin film integrated circuit of FIG. 2, after an array of minute circuit crossovers (only three being shown) have been simultaneously bonded to respectively aligned bond sites forming part of the circuit;

FIG. 4 is a simplified side elevational view of a suitable illustrative fixture for aligning the bond sites on a typical substrate-supported integrated circuit relative to an array of associated crossovers fabricated and temporarily supported on the subject grooved frame, and FIG. 5 is an enlarged, detail sectional view, taken along the line 5—5 of FIG. 1, illustrating one preferred type of multi-layered crossover.

DETAILED DESCRIPTION OF THE INVENTION

It should be appreciated that the methods and apparatus as embodied herein, and described in detail hereinbelow, have universal application in bonding metallic, interconnecting circuit crossovers to respectively associated bond sites on diverse types of substrate-supported electrical circuits of not only the thin or thick film type, but also of the conventional printed circuit type, utilizing discrete and/or hybrid integrated circuit devices. For purposes of illustration, however, the subject invention is described herein in connection with one preferred application, namely, in generating an array of minute crossovers for use in completing interconnections on a ceramic substrate-supported thin film circuit.

Figure 1:
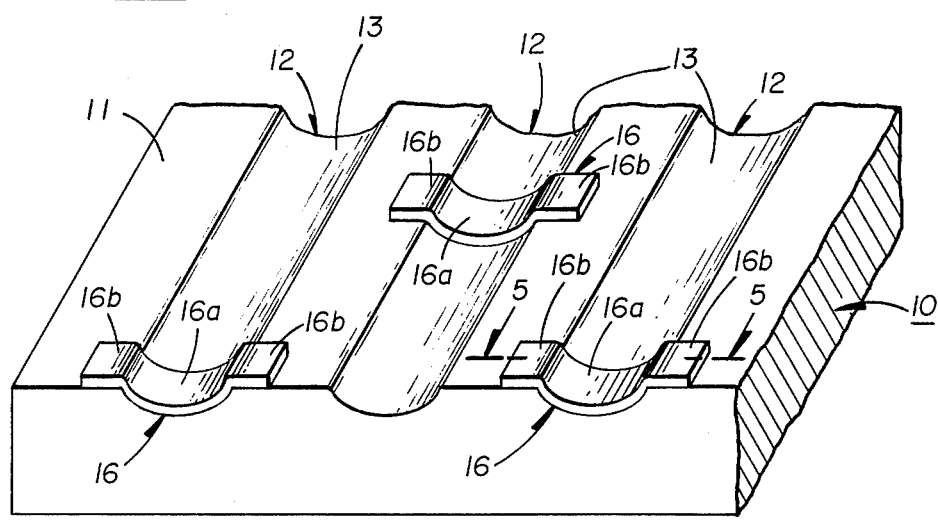
FIG. 1 is an enlarged, fragmentary perspective view illustrating the molybdenum frame formed with a patterned array of concave grooves on one side thereof, which grooves allow the intermediate arches of a patterned array of associated crossovers to be formed directly therein at the same time that the integral planar end portions of the crossovers are being formed during a common plating operation, through a suitable photoresist mask (not shown), in accord with the principles of the present invention.

With particular reference first to FIG. 1, a substantially planar frame member 10, hereinafter simply refered to as the frame, is formed on at least one side 11 with a plurality of spaced, parallel extending grooves 12, each having a concave, or semi-circular base 13. The frame 10 is uniquely employed in generating an array of minute conductive circuit crossovers 16, with arched intermediate regions 16a, on the grooved side 11 thereof.

Considered more specifically, the uniquely constructed frame 10 allows an array of crossovers 16 to be fabricated in accordance with a completely additive process, i.e., the crossovers are directly plated, through a patterned photoresist-applied mask (not shown), directly on the grooved side 11 of the frame 10, with no chemical etching operations being required. With the crossover-defined windows developed in the photoresist mask being oriented such that each window extends across, i.e., perpendicularly to an associated groove 13 in the frame, the required intermediate arched region of each crossover is inherently formed within the associated concave groove 13 during the plating-formation of the crossovers. Considered another way, the central arched region 16a and the integral opposite end planar (two-dimensional) end regions 16b of each crossover are advantageously simultaneously formed during the common plated buildup thereof in accordance with the principles of the present invention.

Figure 2:
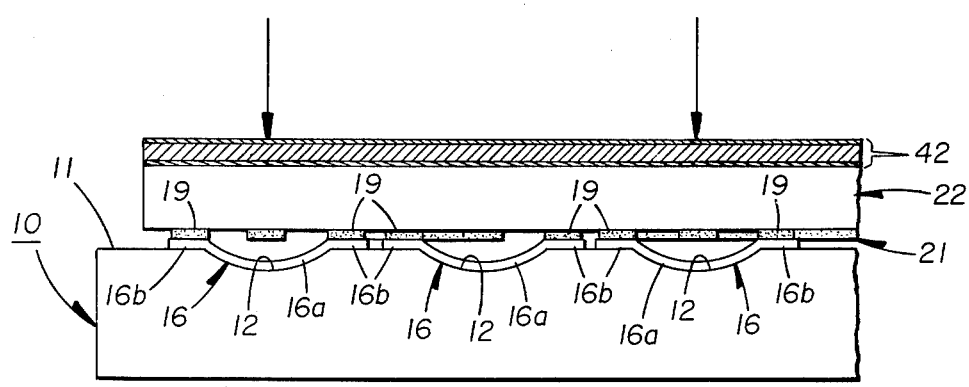
FIG. 2 is an end view of the molybdenum frame, which functions not only as a temporary carrier for each successive array of crossovers previously plated on the grooved side thereof, but as a bonding member when positioned in proper alignment with an associated circuit, such as of the thin film type, previously fabricated on a ceramic-supporting substrate.

After the plating operation, and the removal of the photoresist by any conventional means, the generated array of frame-supported crossovers are aligned with, and simultaneously batch-bonded to, respectively associated bond sites 19 of an otherwise completely fabricated circuit 21, such as of the thin film integrated circuit type supported on a substrate 22, while positioned relative to each other as schematically illustrated in FIG. 2.

With the frame 10 preferably being made of molybdenum, and with the bond sites of the circuit 21 normally having at least an upper exposed layer of gold, the bond strength between each crossover 16 and the associated bond sites 19 will be considerably greater than the plated bond strength initially established between each crossover and the frame 10. As such, the frame may be cleanly peeled from the array of circuit bonded crossovers for reuse, leaving the generated array of crossovers 16 reliably and permanently secured to the respectively associated bond sites of the circuit 21, as illustrated in FIG. 3.

Advantageously, as previously mentioned, the weaker bond strengths established between the frame 10 and crossovers 16 also inherently provide a reliable way of simultaneously testing the adequacy of the individual bonds established between each crossover and the pair of respectively associated bond sites of the circuit. Should any particular crossover not be satisfactorily bonded to a given circuit bond site, that crossover can be readily observed by reason of normally remaining on the frame and, in most cases, by also not being impaired during the peeling of the frame from the circuit, may be individually needle-bonded to the circuit as a final repair operation. Of course, should any crossover be ascertained to be defective, either as a result of being unsatisfactorily formed during plating, or damaged during either the bonding operation or subsequent peeling of the frame from the circuit bonded crossovers, a new crossover may be readily substituted for the defective crossover.

With respect to the crossover-supporting frame 10, molybdenum has been found to be the most advantageous choice of all possible frame materials available, for a number of reasons. First, the frame must remain hard and stable dimensionally during repeated use at elevated temperatures and pressures in order to function as a reliable bonding member, as illustrated in FIGS. 2 and 4. Dimensional stability is of particular importance when a randomly distributed array of crossovers, extending over a relatively large circuit surface area, are to be bonded to the circuit simultaneously, with uniform forces imparted thereagainst.

Other attributes of molybdenum as the frame material relate to the fact its thermal coefficient of expansion advantageously closely matches that of high alumina ceramic, which is a preferred integrated circuit substrate material. Molybdenum is also conducive to being chemically, as well as mechanically, milled at reasonable costs, and is resistant to attack by photolithographic processing chemicals.

With particular reference to the crossovers 16, they may be formed of solid gold, but preferably, and primarily because of cost, are formed as multi-layered elements, comprised, for example, of successive plated layers of Cu and Au, or Ni, Cu and Au. FIG. 5 illustrates one preferred form of the latter type of multi-layered crossover, comprised of an underlayer 23 of Ni, having a typical thickness of approximately 5-10 microns, an intermediate layer 24 of Cu, having a thickness of approximately 15-25 mircrons, and an outer layer 26 of soft gold, having a thickness of approximately 5-15 microns. In some applications it may be desirous to utilize a very thin outer layer of indium, such as in the range of 2-4 microns, in order to reduce the bonding pressure otherwise required to effect bonds with a given peel strength. A problem in using indium, however, is that it has a lower melting point than gold and, hence, has a tendency to flow beyond the bond site interfaces unless the bonding temperature and pressure are carefully controlled.

The degree of curvature of the arches formed in the crossovers will depend, of course, on the dimensions of both the crossovers and the circuit paths. With crossovers typically measuring 4 to 6 mils in width, 40 to 80 mils in length, and 25 to 50 microns in thickness, and with the circuit paths to be bridged in a typical thin film circuit measuring 5 to 30 mils in width, and 1 to 10 microns in thickness, it has been found that the grooves 12 in the frame should have a radius of curvature of approximately 4.5 mils. Such dimensioned grooves will produce plated crossover arches with a degree of bow that will reliably bridge the circuit paths in question. In general, for most integrated circuit applications such grooves will normally have a radius of curvature, or an otherwise configured maximum arch height, in the range of 3 to 7 mils, formed in a molybdenum frame having a correlated thickness in the range of 6 to 12 mils.

The step of aligning the array of frame-supported crossovers 16 with the circuit bond sites 19 may be accomplished in any suitable manner. For example, as illustrated in FIG. 4, a fixture 31, with a plurality of properly positioned locating pins 33, may be used for this purpose. By constructing the molybdenum frame 10 with a plurality of locating bores 36 that respectively correspond spatially with the locating pins 33, the frame 10 may be readily positioned on the fixture 31. Should the frame be so thin for a given crossover fabrication application that adequate recessed bores 36 could not be formed therein, the frame could readily be dimensioned such that the bores would extend through the frame in a border region 10a thereof, shown in phantom in FIG. 4, that would protrude beyond the adjacent edge of the circuit substrate not used for alignment purposes. This would allow two or more locating pins 33' to extend completely through the frame without interfering with the positioning of the substrate-supported circuit on the frame.

Thereafter, the bond sites 19 of the circuit 21 may be readily aligned with the respectively associated crossovers 16 by initially forcing at least two edges of the circuit substrate 22 against at least three upwardly extending, fixture-supported locating pins 38, and subsequently lowering the substrate downwardly until contact is made between the respectively aligned crossovers and circuit bond sites. Such desired alignment may be temporarily retained by using a conventional adhesive, such as Rohm and Haas's Acryloid B7, applied, for example, to only diagonally opposed corners (not shown) of the frame 10 prior to positioning the circuit substrate 22 thereon.

As thus aligned and temporarily secured, the crossover-supporting frame 10 and circuit-supporting substrate 22 may be readily removed from the fixture 31, and inserted in a conventional thermo-compression bonder (not shown) to effect the permanent bonding of the crossovers 16 to the respectively associated circuit bond sites 19. One such bonder that is particularly adapted for this application is disclosed in the aforementioned Burns et al. U.S. Pat. No. 3,762,040.

In connection with whatever type of bonder is employed, it should be appreciated that due to dimensional variations in the substrate, it is extremely difficult to simultaneously bond an array of crossovers with relatively high pressure, such as in the range of 600–900 psi, to multiple circuit bond sites, extending over an appreciable area of a substrate, without inducing cracks therein. Such dimensional variations are often due to a lack of parallelism between the major surfaces due to waviness, warpage, foreign particles, etc. In order to obviate such bonding-induced substrate cracking, a compensating member 42, symbolically shown in FIG. 2 and comprised, for example, of an aluminum screen, such as of 14 mesh wire, woven to have a thickness of 40 mils, sandwiched between two 3 to 5 mils thick molybdenum sheets, may be employed to compensate for any of the aforementioned types of dimensional variations in a given substrate. The outer molybdenum sheets are employed to prevent the bonding of the interposed screen to the ram of the bonder, or to the back major surface of the substrate, or both. The construction of such a composite compensating member is more fully described and disclosed in the aforementioned Burn's et al. patent.

In a typical crossover bonding operation, it has been found that applying a bonder ram pressure of approximately 2,000 psi through the compensating member to the substrate, so as to establish direct bond site crossover interface bonding pressure on the order of 750 psi, at a temperature of approximately 350° C., and for a duration of about 35 seconds, will effect reliable bonding of the array of crossovers to the circuit bond sites. This is particularly the case when the crossovers, as previously noted, are on the order of 40 to 80 mils in length, 4 to 6 mils in width, and 25 to 50 microns in thickness, with each crossover having a first underlayer of nickel, 5–10 microns, an intermediate layer of copper, 15–25 microns, and an outer layer of soft gold, 5–15 microns in thickness, and with the bond sites being formed with an approximately 12,000 angstrom layer of gold plated on about a 2,000 angstrom layer of palladium which, in turn, has about a 2,000 angstrom layer of titanium. Such circuit bond sites typically form extensions of associated thin film conductive circuit paths processed on high alumina substrates.

It should be appreciated, of course, that the degree of force and heat, as well as duration thereof, required to effect thermo-compression bonds with a given bond strength may vary appreciably from the example given above when different types of mating interface materials are involved. By way of further illustration in this regard, for thin film resistors the circuit would typically comprise a multi-layered build-up of gold, palladium, titanium and tantalum nitride, whereas for thin film resistors and capacitors, the circuit would typically comprise a multi-layered build-up of gold, nichrome, gold, nichrome, tantalum nitride, beta tantalum and tantalum pentoxide.

With respect to bonding, it should also be apparent that other discrete circuit elements can also be bonded to the substrate-supporting circuit simultaneously with the bonding of the array of crossovers thereto. For example, if it is desired to bond one or more beam-leaded devices, or other types of integrated circuit chips (none shown) to the circuit, such devices may be temporarily secured by any suitable means, such as by an adhesive, within nesting regions (not shown) formed in the frame at the appropriate locations. These devices would thereafter be transferred to and bonded, together with the crossovers, to the common associated circuit. The recessed nesting regions would normally be required so that the devices would protrude above the planar surfaces on the grooved side of the frame only sufficiently to effect the bonding thereof to the circuit, while at the same time insuring that the bonding forces imparted thereagainst would not damage the devices. The primary advantages in being able to bond not only the circuit crossovers, but any associated devices and/or components to a common substrate-supported circuit simultaneously, are that not only damage to the various circuit elements would be minimized, primarily as a result of eliminating many otherwise necessary handling and positioning operations, but bonding costs would also be substantially reduced.

In summary, it has been shown that through the use of a uniquely constructed molybdenum frame, a completely additive fabrication method may advantageously be employed to form an array of minute interconnecting circuit crossovers directly on the frame, using photolithographic and plating processes, with the requisite arches of the crossovers being directly formed within specially configured grooves of the frame during the plating operation. The frame is thereafter initially used as a temporary crossover carrier member, and subsequently as a bonding member during the thermo-compression bonding of the individual crossovers to respectively associated bond sites of the circuit, which typically may be of the thin or thick film type. Such a simplified additive crossover generating technique has been shown to make possible appreciable direct and indirect cost savings, and has the capability of significantly increasing circuit yields, over those realized with prior crossover fabrication processes, by obviating the need of not only potentially circuit-damaging chemical etching operations, but the many associated processing and handling steps associated therewith.

We claim:

1. A method of forming a circuit crossover, with an arched intermediate region, for subsequent use in crossing over an intervening circuit element of a substrate-supported circuit, comprising the steps of:
   forming a mask-defined, exposed area on one planar surface of a frame member such that said exposed area extends across and a predetermined distance beyond opposite sides of a groove, previously formed with a concave base, in the one surface of the frame member;
   plating said exposed surface area of said frame member to form a metallic crossover, of predetermined thickness, with two planar end regions interconnected by an intermediate arched region, the latter being formed within the concave base of said groove, said completely formed crossover thereafter remaining on the frame member until subsequently transferred to an associated circuit.

2. A method in accordance with claim 1 further comprising the step of removing said mask prior to the time when said formed crossover is transferred to an associated circuit.

3. A method in accordance with claim 1 wherein a predetermined mask-defined, patterned array of exposed areas are formed on said one planar surface of the frame member such that each exposed area extends across and a predetermined distance beyond opposite sides of a different one of a plurality of spaced, parallel extending grooves, previously formed with concave bases, in the one surface of the frame member, and wherein a metallic crossover is plated on each exposed surface area of said frame member so as to simultaneously form an array thereof for subsequent transfer to an associated circuit.

4. A method in accordance with claim 3 further comprising the step of removing said mask-defined pattern from said frame member prior to the time when said arrray of formed crossovers are transferred to an associated circuit.

5. A method in accordance with claim 2 further comprising the steps of:
   aligning the terminating end regions of said plated crossover formed on the frame member with spaced and respectively associated circuit elements forming bond sites of a substrate-supported circuit;
   bonding the terminating end regions of the crossover to the respectively aligned bond sites of the circuit such that the bond strength between the crossover and the circuit is considerably greater than the plated bond strength initially established between the crossover and the frame member, and
   removing the frame member from the circuit bonded crossover, for reuse.

6. A method in accordance with claim 4 further comprising the steps of:
   aligning the terminating end regions of each of the array of plated crossovers formed on said frame member with spaced and respectively associated bond sites of the circuit;
   bonding the terminating end regions of each crossover to the respectively aligned bond sites of the circuit such that the bond strength between each crossover and the circuit is considerably greater than the plated bond strength initially established between each crossover and the frame member, and
   removing the frame member from the array of circuit-bonded crossovers, for reuse.

7. A method in accordance with claim 6 wherein said mask-defined pattern is formed by a photolithographic process, and wherein said plating step comprises a series of plating operations that form a composite multi-layered crossover, each layer being comprised of a different metallic material, with the outer layer being gold.

8. A method in accordance with claim 7 wherein said frame member is made of a thin sheet of molybdenum, and said circuit comprises a thin film circuit fabricated on a high alumina ceramic substrate.

9. A method of fabricating an array of circuit crossovers, with arched intermediate regions, on a substrate-supported circuit, comprising the steps of:
   forming a predetermined mask-defined, patterned array of exposed areas on one surface of a frame member such that each exposed area extends across and a predetermined distance beyond opposite sides of a different one of a plurality of grooves, each previously formed with a concave base, in the one surface of the frame member;
   plating each exposed surface area of said frame member to form a metallic crossover, of predetermined thickness, with two planar end regions interconnected by an intermediate arched region, the latter being formed within the concave base of each groove;
   removing said mask-defined pattern from said frame member;
   aligning the terminating end regions of each of the array of plated crossovers formed on said frame member with spaced and respectively associated bond sites of the circuit;
   bonding the terminating end regions of each crossover to the respectively aligned bond sites of the circuit such that the bond strength between each crossover and the circuit is considerably greater than the plated bond strength initially established between each crossover and the frame member, and
   removing the frame member from the array of circuit-bonded crossovers, for reuse.

10. A method in accordance with claim 9 wherein said mask-defined pattern is formed by a photolithographic process.

11. A method in accordance with claim 10 wherein said frame member is made of a thin sheet of molybdenum, and said circuit comprises a thin film circuit fabricated on a high alumina ceramic substrate.

12. A method in accordance with claim 9 wherein said plating step comprises a series of plating operations that form composite multi-layered crossovers, each crossover layer being comprised of a different metallic material, with the outer layer being gold.

13. A method in accordance with claim 9 wherein said crossover plating step involves plating a first layer of nickel, an intermediate layer of copper and an outer exposed layer of gold on each mask-exposed area of said frame.

14. A method in accordance with claim 12 wherein said crossover plating step further includes the step of plating a thin layer of indium on the outer layer of gold.

15. A method in accordance with claim 9 wherein said bonding step involves the application of predetermined heat and pressure to said aligned and contacting frame and circuit so as to effect thermo-compression bonds between each of said crossovers and the respectively associated bond sites of said circuit.

16. A method in accordance with claim 15 wherein a compensating member is interposed between the backside of said circuit substrate and a driving member of a bonder so as to compensate for dimensional variations in said substrate and to, thereby, impart substantially uniform bonding pressure to all of said crossovers simultaneously.

* * * * *